(12) United States Patent
Roth et al.

(10) Patent No.: US 10,241,168 B2
(45) Date of Patent: Mar. 26, 2019

(54) MAGNET COIL ASSEMBLY, COMPRISING AN HTS STRIP CONDUCTOR AND AN LTS WIRE, WHICH FORM A JOINT

(71) Applicant: BRUKER BIOSPIN GMBH, Rheinstetten (DE)

(72) Inventors: Gerhard Roth, Rheinstetten (DE); Arne Kasten, Karlsruhe (DE)

(73) Assignee: Bruker BioSpin GmbH, Rheinstetten (DE)

( * ) Notice: Subject to any disclaimer, the term of this patent is extended or adjusted under 35 U.S.C. 154(b) by 281 days.

(21) Appl. No.: 15/024,044

(22) PCT Filed: Oct. 2, 2014

(86) PCT No.: PCT/EP2014/071208
§ 371 (c)(1),
(2) Date: Mar. 23, 2016

(87) PCT Pub. No.: WO2015/049358
PCT Pub. Date: Apr. 9, 2015

(65) Prior Publication Data
US 2016/0216347 A1    Jul. 28, 2016

(30) Foreign Application Priority Data

Oct. 4, 2013   (DE) .......................... 10 2013 220 142

(51) Int. Cl.
*G01R 33/3815*   (2006.01)
*G01R 33/46*   (2006.01)
*H01F 6/06*   (2006.01)

(52) U.S. Cl.
CPC ......... *G01R 33/3815* (2013.01); *G01R 33/46* (2013.01); *H01F 6/06* (2013.01); *H01F 6/065* (2013.01)

(58) Field of Classification Search
CPC ............................ G01R 33/3815; G01R 33/46
See application file for complete search history.

(56) References Cited

U.S. PATENT DOCUMENTS 7,310,034 B2 * 12/2007 Schlenga ........... G01R 33/3815
                                                            335/216
8,565,845 B2   10/2013 Kobayashi
(Continued)

FOREIGN PATENT DOCUMENTS

CN        101075496           11/2007
CN        101 694 908          4/2010
(Continued)

*Primary Examiner* — Jermele M Hollington
*Assistant Examiner* — Feba Pothen
(74) *Attorney, Agent, or Firm* — Paul Vincent

(57) ABSTRACT

A magnet coil system (1) has a first end section (19*a*) of an HTSL-tape conductor (4) located ahead of a first end (19) of an HTSL-tape conductor (4) and a first end section (20*a*) of an LTS wire (7) located prior to a first end (20) of the LTS wire (7) which are connected electrically but not in a superconducting way in a connecting section (17) along the length of the connecting section. The LTS wire (7) has a flat shape at least within the connecting section (17) and one side of the flat LTS wire (7) abutting the HTSL-tape conductor (4) and the connecting section (17) has a length of at least 5 m. The magnet coil system has an acceptably small residual ohmic resistance which is achieved by simple means.

19 Claims, 7 Drawing Sheets

(56) References Cited

U.S. PATENT DOCUMENTS

| | | | |
|---|---|---|---|
| 2004/0155739 A1 | 8/2004 | Arndt | |
| 2006/0066429 A1 | 3/2006 | Kasten | |
| 2009/0045895 A1 | 2/2009 | Kasten | |
| 2009/0264297 A1 | 10/2009 | Nardelli | |
| 2009/0291850 A1 | 11/2009 | Schneider | |
| 2010/0029487 A1 | 2/2010 | Kobayashi | |
| 2010/0290764 A1* | 11/2010 | Borgmeier | F16L 25/01 392/468 |
| 2012/0021915 A1* | 1/2012 | Kodama | G01R 33/3815 505/162 |

FOREIGN PATENT DOCUMENTS

| | | |
|---|---|---|
| CN | 202 887 898 | 4/2013 |
| DE | 39 05 424 | 8/1990 |
| JP | 03-217009 A | 9/1991 |
| WO | WO 2012/004581 | 1/2012 |

* cited by examiner

MAGNET COIL ASSEMBLY, COMPRISING AN HTS STRIP CONDUCTOR AND AN LTS WIRE, WHICH FORM A JOINT

This is the national stage of PCT/EP2014/071208 filed Oct. 2, 2014 and also claims Paris convention priority from DE 10 2013 220 142.7 filed Oct. 4, 2013.

BACKGROUND OF THE INVENTION

The invention concerns a magnet coil system comprising
at least one coil section, wound with a high temperature superconducting (=HTSL) tape conductor,
and a low temperature superconducting(=LTS) wire,
the HTSL tape conductor and the LTS wire being electrically connected in series.

Such a magnet coil system is known e.g. from DE 10 2004 007 340 A1 (=U.S. Pat. No. 7,157,999).

Superconductors are able to carry electrical currents essentially without ohmic losses. In particular, they are used wherever high electric current strengths are needed, e.g. in magnet coils.

Generally, magnet coils make use of two types of superconductors. Metallic low temperature superconductors (LTS), as NbTi or Nb3Sn are usually wires containing filaments of the LTS material. Ceramic high temperature superconductors (HTS or HTSL), e.g. of the ReBCO type, usually comprise an HTS layer on a tape-like substrate, for example a steel tape. HTSL superconductors of the BSCCO type have also usually the shape of a tape. However, they comprise like the LTS conductors filaments, usually embedded in a silver matrix.

DE 10 2004 007 340 A1 (=U.S. Pat. No. 7,157,999), proposes a magnet field system with radially stacked partial coils, an LTS partial coil and an HTS partial coil being electrically connected in series via an LTS-HTS joint. No details concerning the joint design are disclosed.

A joint effects a transfer of current between two superconductor parts. Thereby it is technically demanding to achieve a current transfer between the superconductor parts that is really superconducting. Often an in fact extremely small but noticeable ohmic resistance at a joint has to be accepted. The latter is in particular true for joints between LTS and HTS materials. Such ohmic resistances can in particular lead to a disruptive drift during persistent mode operation of a magnet coil system.

The basic purpose of the invention is to achieve in an easy way an acceptably small remaining ohmic resistance in a magnet coil system of the above mentioned kind. In particular, the magnet coil system should allow a sufficiently small drift during operation in persistent mode.

SUMMARY OF THE INVENTION

This purpose is achieved by a magnet coil system as described above, characterized in that the HTSL tape conductor and the LTS wire form a joint, in which a first end section of the HTSL tape conductor located ahead of a first end of the HTSL tape conductor and a first end section of the LTS wire located ahead of a first end of the LTS wire are connected electrically in a connecting section, and the connecting section exhibiting a length of at least 0.5 m.

According to the invention, the HTSL tape conductor and the LTS wire are connected in an electrically conductive way along a substantial length, i.e. along a connecting section that is longer than a multiple of the widths of the involved conductors (usually by a factor of at least 10 or at least 100).

In the connecting section, the HTSL tape conductor and the LTS wire overlap and are guided parallel to each other. They have an ohmic contact (i.e. usually not superconducting), typically by means of one or more metallic layers (e.g. copper layers) and/or solder.

Because of the substantial length of the connecting section of at least 0.5 m and typically 5 m or more, preferably 10 m or more or even 20 m or more or because of the respectively large area over which a transverse current transition can be effected, the ohmic transverse resistance is very small and can nearly be neglected for typical magnet coil applications, resulting in a quasi-superconducting connection. In particular, the joint generates only a very small drift in the case of persistent mode operation of the magnet coil according to the invention, which can easily be counterbalanced by state of the art compensation methods in case that turns out to be necessary or desirable.

Embodiments with Wound Up Connecting Sections

In a particularly preferred embodiment of the magnet coil system according to the invention, the connecting section is wound up. In this way, the connecting section can be arranged in a space saving way, and moreover it becomes in a simple way possible to purposefully orient the connecting section and the HTSL tape conductor contained therein, respectively, with respect to the magnetic field generated by the magnet coil system. In particular, it is possible to achieve an orientation and/or position, where in the entire connecting section the generated local magnetic field essentially runs parallel to the local tape plane. In particular, a support structure for the connecting section may be provided, comprising a guide means for the HTSL tape conductor (and for the LTS wire; for example milled into the support structure) guiding the HTSL tape conductor such that its local tape plane is everywhere parallel to the direction of the local magnetic field generated by the magnet coil system. The magnetic field distribution of the magnet coil system may be calculated beforehand. In this way, the current carrying capacity of the HTSL tape conductor in the connecting section may be optimized. Alternatively, it is also possible to shape the connecting section for example in the form of a clew and to introduce it into a container.

In a preferred improvement of this embodiment, in the range of the connecting section a respective local tape plane of the HTSL tape conductor essentially extends along a winding axis and the connecting section is positioned such that during operation of the magnet coil system the magnetic field generated by the magnet coil system in the range of the connecting section is essentially directed parallel to the winding. In this way, too, an orientation of the HTSL tape conductor with respect to the static magnetic field can be achieved which is favorable for a good current carrying capacity. The local tape plane is determined by the local tangent plane of the tape conductor. According to this variant, everywhere within the connecting section the local tape plane runs essentially parallel to the winding axis. Typically, the tape conductor is wound about the winding axis winding by winding; likewise the tape conductor may wound about the winding axis with several windings per layer (in one or more layers). In the easiest case, the winding is onto a cylindrical winding form. By the positioning and alignment of the connecting section or the winding axis, respectively, in the magnetic field according to this improvement it is automatically ensured that the magnetic field locally runs essentially parallel to the superconducting HTSL layer in the tape conductor. In this way maximum possible critical currents in the HTSL tape conductor are established. Within the frame of the invention, "alignment" will be considered "essentially parallel" for deviations from an exactly parallel alignment being less than 20°, preferably less than 10°, in a particularly preferred variant less than 5°.

In this embodiment, the winding axis is preferably tilted with respect to a coil axis of the magnet coil system, in particular by a tilt angle between 20° and 70°, preferably between 30° and 60°. By tilting the winding axis with respect to the coil axis (longitudinal axis of the magnet coil system) an adaption to the distribution of the local magnetic field lines can be effected, and transverse components of the magnetic field acting onto the HTSL tape conductors can be minimized. The connecting section can be arranged in an extended spatial area.

In a further preferred embodiment, the connecting section is wound in the manner of a pancake-coil. In this case, each layer comprises only one winding (of HTSL tape conductor and of LTS wire), which can be wound particularly easily, avoiding the bending involved in layer transitions. The connecting section of this embodiment may essentially be disc shaped and if desired slightly bent in order to effect an adaption to the local magnetic field distribution and to maximize the current carrying capacity. The local disc plane runs essentially perpendicular to the local magnetic field lines.

In an alternative embodiment, the connecting section is wound in the manner of a solenoidal coil. In In this case, several axially neighboring windings are wound in a layer; the solenoidal coil may comprise one or also more radially stacked layers. In this embodiment, considerable lengths of the connecting section, in particular 10 m or more, may be arranged in a spatially compact way; a radial extension of the wound connecting section can (in comparison to a pancake coil) be kept small, rendering it much easier to keep the angle between the local magnetic field and the local tape plane small.

In this embodiment, the connecting section is preferably wound around a solenoid coil axis which is curved, in particular the curvature of the solenoid coil axis follows the field lines of a local magnetic field generated during operation of the magnet coil system. In this way, a transverse component of the magnetic field acting onto the HTSL tape conductor in the connecting section can be minimized thereby optimizing the current carrying capacity. This embodiment is particularly useful in case the wound connecting section has a considerable axial extension.

In a preferred embodiment, the connecting section is wound onto a winding form with a circular outer cross section. In this way, the curvature of the HTSL tape conductor via its long edge can be kept consistently small, thereby avoiding defects in particular in the HTSL layer of the tape conductor.

In an alternative embodiment, the connecting section is wound onto a winding form having an elongated outer cross section that is rounded down at opposite ends. The elongated outer cross section makes it possible to keep the spatial requirement of the wound connecting section along a transverse direction small, which in certain cases may simplify the arrangement of the wound connecting section inside a cryostat. It is also possible, in particular by means of the angular positioning of the winding form, i.e. the alignment of the longer and shorter transverse axis with respect to the local magnetic field, to minimize the transverse components of magnetic field acting on the HTSL tape conductor and thereby to optimize the current carrying capacity.

In a particularly preferred improvement, said first ends of the HTSL tape conductor and the LTS wire are located on the same side of the connecting section and the connecting section is wound such that said first ends of the HTSL tape conductor and of the LTS wire have a radially inner position. In this way, in the range of the connecting section opposite current flow directions are achieved in the HTSL tape conductor and in the LTS wire, respectively, minimizing a magnetic field generated by the current flow in the connecting section. Moreover, winding of the connecting section becomes very easy.

General Embodiments of the Magnet Coil System

In a preferred embodiment, the connecting section has a length of at least 10 m. A greater length of the connecting section ensures a particularly extensive reduction of the ohmic resistance between the HTSL tape conductor and the LTS wire. In practice, also 20 m or more may be chosen for the length of the connecting section. The length of the connecting section along the extension of the conductors (or extension in current or countercurrent direction, respectively) may easiest be determined in the unwound state.

In an advantageous embodiment, at least in the range of the connecting section the LTS wire has a flat shape, in particular with a width of the flat LTS wire that corresponds to that of the HTSL tape conductor. As a consequence, the flat LTS wire may very well be attached with one side to the HTSL tape conductor; for equal widths, the area available for transverse current exchange is optimized. Typically, the LTS wire is rolled flat in the connecting section. Apart from that, as a rule the LTS wire has a round or rectangular cross section.

In a further preferred embodiment, in the range of the connecting section covers of LTS filaments of the LTS wire are removed in part or completely, in particular edged away or dissolved. In this way, the ohmic resistance of the current transition to the HTSL tape conductor is minimized. Insofar the LTS wire comprises an insulation, this is of course also removed in total or partly in the range of the connecting section in order to establish a flat electrical contact. Similarly, cover parts of the LTS wire, for example a copper cover, may be removed completely or in part.

In another advantageous embodiment, in the range of the connecting section one or more protective coatings and/or shunt-layers on an HTSL layer of the HTSL tape conductor are removed, in particular edged away or dissolved. In this way, the ohmic resistance of the current transfer to the LTS wire is minimized. Insofar the HTSL tape conductor comprises an insulation, this insulation is of course also removed in the range of the connecting section either completely or in part in order to establish a two-dimensional electrical contact.

In a particularly preferred embodiment, the HTSL tape conductor and the LTS wire of the connecting section are soldered to each other using solder. By means of solder, an electrically well conducting, two-dimensional contact between the HTSL tape conductor (or its HTSL layer, respectively) and the LTS wire (or its LTS filaments, respectively) may be established. Typically, the solder is applied continuously along the entire length of the connecting section and across the entire width of the HTSL tape conductor.

In an advantageous variant, the solder comprises tin. Solder containing tin may be handled particularly easily and becomes liquid at comparatively low temperatures, thereby avoiding or at least minimizing damage of the HTSL material during the soldering process.

In a further advantageous embodiment, the connecting section has an axial distance from the coil section which is wound with the HTSL tape conductor. In this way, the magnetic field strength at the connecting section may be reduced, thereby improving the current carrying capacity of the joint. In general, the magnetic field in the range of the connecting section is reduced to about 1/10 or less of the maximum magnetic field of the magnet coil system (in the magnetic center).

In a preferred embodiment, the LTS wire comprises filaments that contain NbTi. In practice, using NbTi as LTS material has proven to be a good choice in order to very reliably produce joints to HTSL tape conductors according to the invention, in particular to those of the ReBCO type.

In an equally preferred embodiment, the HTSL tape conductor comprises an HTSL layer containing ReBCO, in particular containing YBCO, with Re: element of the rare earths group. In practice, using ReBCO as HTSL material has proven to be a good choice in order to very reliably produce joints to LTS wires according to the invention, in particular to LTS wires comprising NbTi.

Embodiments with Further or Additional Joints

An also preferred embodiment of a magnet coil system according to the invention comprises an additional LTS wire, the LTS wire and the additional LTS wire containing different superconducting LTS materials, in particular the additional LTS wire containing Nb3Sn, and the LTS wire exhibits an additional joint at a second end section ahead of a second end spaced apart from the HTSL tape conductor, the additional joint connecting the LTS wire to an end section of the additional LTS wire. The additional joint (usually between NbTi and Nb3Sn) may be designed according to the known state of the art. The additional LTS wire may for example be part of a further coil section of the magnet coil system. The LTS wire (usually on the basis of NbTi) may in this connection act as a link between the HTSL tape conductor and the additional LTS wire (usually on the basis of Nb3Sn), in case directly jointing the HTSL tape conductor and the additional LTS wire should prove to be technologically difficult (e.g. because of a necessary heat treatment/annealing of the additional LTS wire bases on Nb3Sn, which happening next to an HTSL might damage the HTSL).

In an equally preferred embodiment, the magnet coil system comprises a further LTS wire, the HTSL tape conductor forming at the first end section ahead of its first end the joint to the LTS wire and at a second end section ahead of a second end of the HTSL tape conductor a further joint to the further LTS wire, in particular the LTS wire and the further LTS wire containing the same superconducting LTS material. In this embodiment, the HTSL tape conductor may easily be integrated into a persistent mode operation of the magnet coil system. The HTSL tape conductor may be connected on both sides with low ohmic resistance via the LTS wire and the further LTS. In this embodiment, the further joint is designed according to the joint described above (between HTSL tape conductor and LTS wire).

The invention also encompasses an NMR spectrometer (NMR=nuclear magnetic resonance) comprising a magnet coil system according to the invention as described above.

Further advantages of the invention may be derived from the specification and the drawings. Moreover, within the frame of the invention, the features mentioned above and those presented further below may each be used on its own or in any combination. The embodiments presented and described are not to be understood as a concluding list, rather have exemplary character for presentation of the invention.

The invention is presented in the drawing and is further explained by means of specific embodiments. The figures show:

DESCRIPTION OF THE PREFERRED EMBODIMENT

Figure 1:
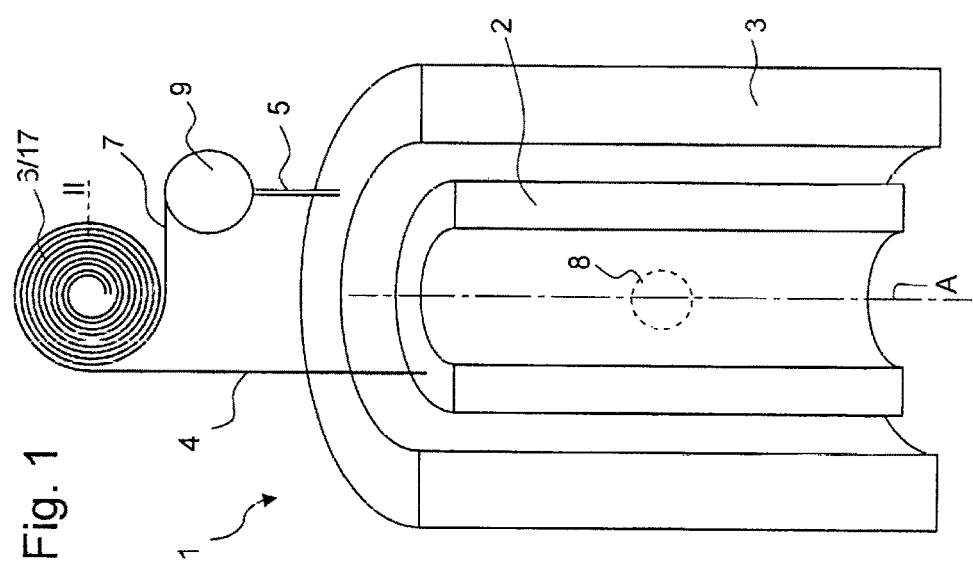
FIG. 1 a schematic, in part longitudinally sectioned representation of an embodiment of a magnet coil system according to the invention, with a connecting section wound to a pancake coil between an HTSL tape conductor and an LTS wire.

FIG. 1 illustrates an embodiment of a magnet coil system 1 according to the invention, which may for example be used as part of an NMR spectrometer, in particular of a high resolution NMR spectrometer. The magnet coil system 1 shown in FIG. 1 comprises two radially stacked coil sections 2, 3, which are electrically connected in series.

The inner, first coil section 2 is wound with at least one HTSL tape conductor 4, in this embodiment in the way of a solenoid around the coil axis A. The HTSL tape conductor 4 is lead with a first end to a joint 6, which forms a low-resistance connection between the HTSL tape conductor 4 and an LTS wire 7, which in the example of in FIG. 1, contains filaments of NbTi. Within the joint 6 the HTSL tape conductor 4 and the LTS wire 7 run along a connecting section 17 parallel to each other via a length of 10 m in this example and are continuously electrically connected along this length, in particular by means of a soldering connection, the connecting section 17 being wound up (in this context see also FIG. 3). Joint 6 is located at an axial distance from the first coil section 2, such that in the range of the joint 6 the magnetic field strength generated by the magnet coil system 1 has fallen to about 1/10 or less of the magnetic field strength present in a sample volume 8 in a central area of the magnet coil system 1.

The second, outer coil section 3 of the magnet coil system 1 is wound with a further LTS wire 5, which, as shown in FIG. 1, contains filaments of Nb3Sn. The LTS wire 7, which contains filaments of NbTi, is connected by a further joint 9 (per se known in the state of the art) to the further LTS wire 5, containing Nb3Sn filaments. In the range of the further joint 9 also a clamping device for the further LTS wire 5 is integrated.

Figure 2:
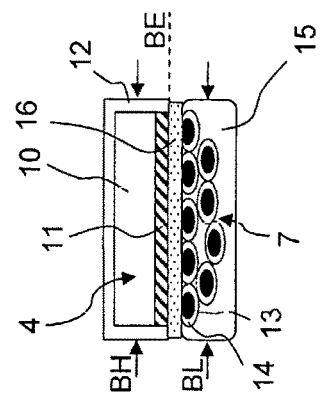
FIG. 2 a schematic cross section across the connecting section in the range of section plane II of FIG. 1 and FIG. 3.

FIG. 2 illustrates the connecting section in joint 6 of FIG. 1 in a schematic cross section (with the cross section plane perpendicular to the extension direction of the HTSL tape conductor 4 and of the LTS wire 7, i.e. the cross section plane of FIG. 2 is oriented perpendicular to the current flow direction).

The HTSL tape conductor 4 comprises a substrate 10, onto which an HTSL layer 11, here from YBCO material, is deposited. The HTSL tape conductor 4 is sufficiently flexible, in order to wind it up (in this context see FIG. 1, FIG. 3); in particular the substrate 10 may be realized in the form of a steel tape. A typical width of the HTSL tape conductor 4 is 2 mm to 60 mm. Between substrate 10 and HTSL layer 11 there are usually arranged one or more buffer layers, e.g. from CeO (not shown in detail). Here, the HTSL tape conductor 4 comprises a shunt layer 12, Cu in this embodiment, encasing the HTSL tape conductor 4 on all sides. However, in the connecting section the encasing has been etched away on the side facing the LTS wire 7.

The LTS wire 7 comprises a multitude of NbTi filaments 13, which in the present embodiment are each encased by an envelope of Nb 14 ("Nb barrier"). The NbTi filaments 13 are arranged within a matrix 15, consisting e.g. of CuMn. In the connecting section, the LTS wire 7 has been milled flat, and part of the matrix 15 has been etched away, such that a part of the NbTi filaments 13 is exposed on the side facing the HTSL tape conductor 4. For this near-surface part of the filaments 13 also the encasing 14 is etched away on the side facing the HTSL tape conductor 4.

The HTSL layer 11 and the NbTi filaments 13 of said near-surface part are in direct contact with a solder 16 having a good electrical conductivity, typically containing tin and/or noble metals, in particular gold and/or silver. In this way, a contact with a good electrical conductivity between the filaments 13 and the HTSL layer 11 is established. It should be pointed out that this contact with a good electrical conductivity extends along the length of the connecting section (here in the direction perpendicular to the plane of projection) of 10 m in the present example and that thereby the ohmic resistance of this contact becomes very small. A typical thickness of solder 16 is between 1 μm and 20 μm.

It should be noted that for an optimum current transfer, the width BL of the LTS wire 7 (e.g. by means of an appropriate milling process) should correspond to the width BH of the HTSL tape conductor 4 and the solder 16 should cover essentially the total width BL and BH, respectively.

Figure 3:
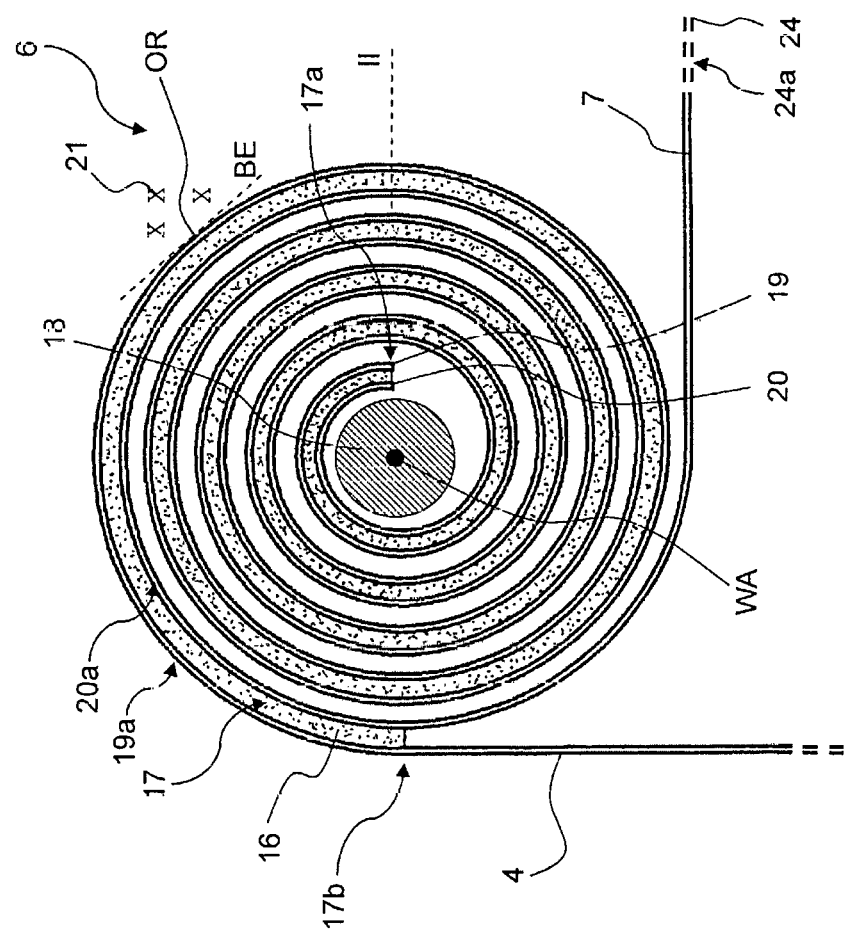
FIG. 3 a partial view of FIG. 1 in the range of the wound connecting section.

FIG. 3 shows the joint 6 of FIG. 1 in in detail. In addition, the section plane II of FIG. 2 is marked.

In the embodiment shown, in joint 6 the HTSL tape conductor 4 and the LTS wire 7 are electrically connected to each other in a spiral-like wound connecting section 17 in a two-dimensional and continuous way, via solder 16 applied between HTSL tape conductor 4 and LTS wire 7. The connecting section 17 is formed by overlapping a first end section 19a of the HTSL tape conductor 4, extending away from a first end 19 of the HTSL tape conductor 4 and a first end section 20a of the LTS wire 7, extending away from a first end 20 of the LTS wire.

In the embodiment shown, the connecting section 17 is wound in the manner of a pancake coil with only one winding per layer about a winding axis WA onto a winding form 18 exhibiting a circular cross section, the winding axis WA being perpendicular to the plane of projection. The winding of the connecting section 17 has the consequence that it can—in spite of its length along the extension direction of the HTSL tape conductors 4 and of the LTS wire 7, respectively, of 10 m in the present example—be arranged in a compact way, typically with a diameter of the winding spiral of 20 cm or less.

The first end sections 19a, 20a start from the first ends 19, 20 of the HTSL wire 4 and of the LTS wire 7, which are positioned at the same side which is the radially inner side of the spiral winding (end side) 17a of the connecting section 17. At the other side (end side) 17b of the connecting section 17, which is the radially outer side with respect to the spiral winding, the HTSL tape conductor 4 and the LTS wire 7 split.

The winding form 18 and the winding axis WA are positioned and oriented in such a way that the local magnetic field 21 generated by the magnet coil system essentially runs parallel to the respective local tape plane BE of the HTSL tape conductor 4 (or parallel to the local surface of the HTSL layer of the HTSL tape conductor 4). This is exemplified in FIG. 3 with respect to an outward positioned winding. The local tape plane BE of the HTSL tape conductor 4 at the position OR extends flush with ("as a tangent") the HTSL tape conductor 4 and perpendicular to the projection plane. The local field lines of the magnetic field 21 close to the position OR still run perpendicular to the projection plane. Correspondingly, the tape plane BE and the field lines are aligned parallel to each other. In this way, the current carrying capacity in the HTSL tape conductor 4 may be optimized. In FIG. 2 a tape plane BE is also shown. It is to be noted that in a wound HTSL tape conductor the tape plane BE will change along the tape conductor ("local tape plane").

Most easily, an appropriate orientation of the HTSL tape conductor 4 with respect to the magnetic field 21 is achieved, if everywhere in the connecting section 17 the local tape plane BE runs at least essentially parallel to the winding axis WA and the winding axis WA on its turn runs at least essentially parallel to the magnetic field 21 in the range of the connecting section 17. As a rule, the winding axis WA will be oriented parallel to the magnetic field in the center of the connecting section 17 (center of the winding form 18). It should be noted that in principle the magnetic field 21 locally varies across the entire range of the connecting section 17/joint 6, since magnetic fields always have closed field lines and are therefore curved. As a consequence, in a real magnet coil system, with a substantial spatial extension of the connecting sections, orientations with respect to the local magnetic field can only be specified within certain tolerances. Insofar as it is specified herein that an orientation of two parameters should be essentially parallel, this condition is met if the (largest) deviation from exact parallel alignment is less than 20°, preferably less than 10° and particularly preferred less than 5°.

In the embodiment shown, a second end section 24a ahead of a second end 24 of the LTS wire 7 in the additional joint 9 is connected to an end section of the additional LTS wire 5 (see FIG. 1; not detailed in FIG. 3).

It should be noted that for superconducting persistent mode operation of the magnet coil system 1 typically a second joint, in particular corresponding to joint 6, or also a second joint arrangement, in particular corresponding to joint 6 and additional joint 9, may be used.

Figure 4:
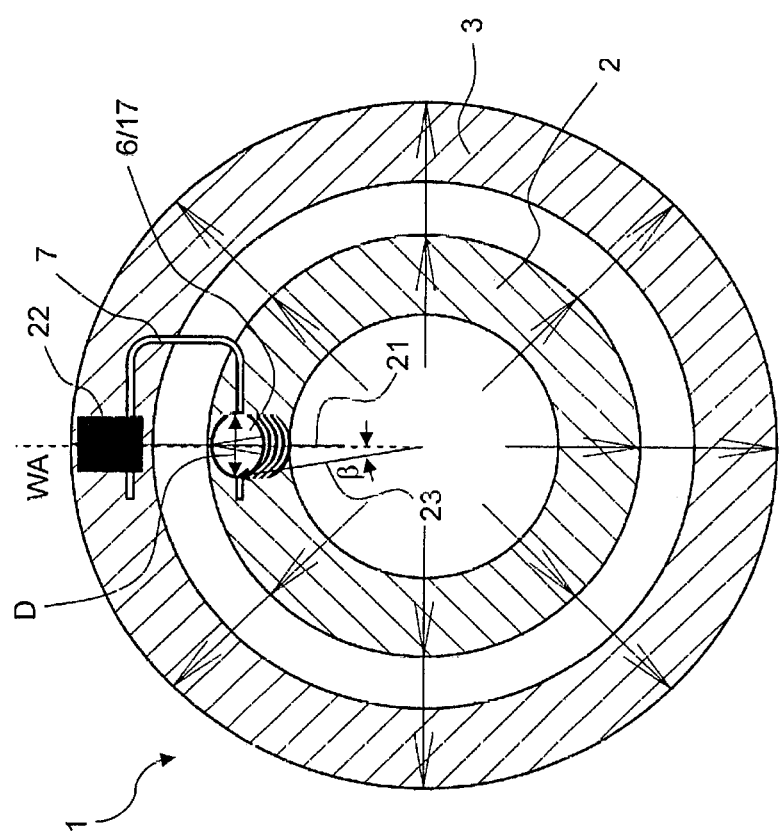
FIG. 4 a schematic top view onto a further embodiment of a magnet coil system according to the invention, with a connecting section wound to a solenoidal coil.
Figure 5:
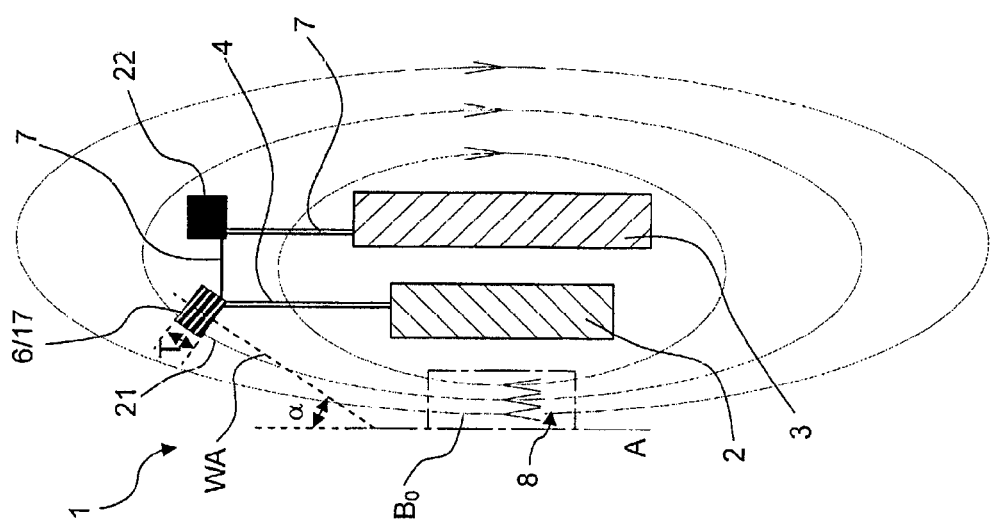
FIG. 5 a schematic longitudinal section across one half of the magnet coil system of FIG. 4.

FIG. 4 and FIG. 5 show a further embodiment of a magnet coil system 1 according to the invention in top view, see. FIG. 4, and in longitudinal section via one half of the magnet coil system 1, see. FIG. 5.

The magnet coil system 1 generates in in an, in this embodiment cylindrical, sample volume 8, typically comprising at least 1 cm³, and preferably 10 cm³, a static magnetic field Bo with a homogeneity of typically 100 ppm or better, preferably 10 ppm or better, particularly preferred 2 ppm or better, prior to of a shimming procedure, i.e. without further homogenizing by means of independent shim coils driven by independent shim currents and/or ferromagnetic shim platelets. Magnet coil system 1 comprises a first coil section 2, wound with an HTSL tape conductor 4, and a second coil section 3, wound with an LTS wire 7. In this embodiment, the LTS wire 7 comprises NbTi filaments. In the embodiment shown, the LTS wire 7 is clamped by means of a clamping device 22, in order to achieve an optimum positioning of the LTS wire 7 in in the second coil section 3.

According to the invention, the HTSL tape conductor 4 and the LTS wire 7 are connected to each other in an electrically conductive way in a joint 6. In the present embodiment, joint 6 comprises a solenoidally shaped wound up connecting section 17, see the individual neighboring turns of the uppermost layer. The HTSL tape conductor 4 and the LTS wire 7 are parallel to each other and two-dimensionally connected to each other wound about a winding axis WA with several windings per layer. The local tape plane of the HTSL tape conductor 4 is everywhere at least essentially oriented parallel to the winding axis WA.

In the embodiment shown, the winding axis WA is tilted by an angle α of ca. 35° with respect to axis A of the magnet coil system 1, in order to align the winding axis WA essentially parallel to the local magnetic field 21 in the connecting section 17 or in the volume of joint 6, respectively.

Because of the small depth T of joint 6 (coil length of the "joint coil") of this embodiment, in the longitudinal section (FIG. 5) parallelism between the winding axis WA and the local magnetic field 21 shows no substantial deviations along depth T. However, it can be noticed in the top view (FIG. 4) that joint 6 has a substantial diameter D. As a consequence, a field line 23 of the local magnetic field 21 in the boundary area of joints 6 already exhibits an angle β of about 7° with respect to the winding axis WA. However, such a small deviation from parallelism only generates a small, still rather acceptable reduction of the current carrying capacity of the joint 6.

Figure 6:
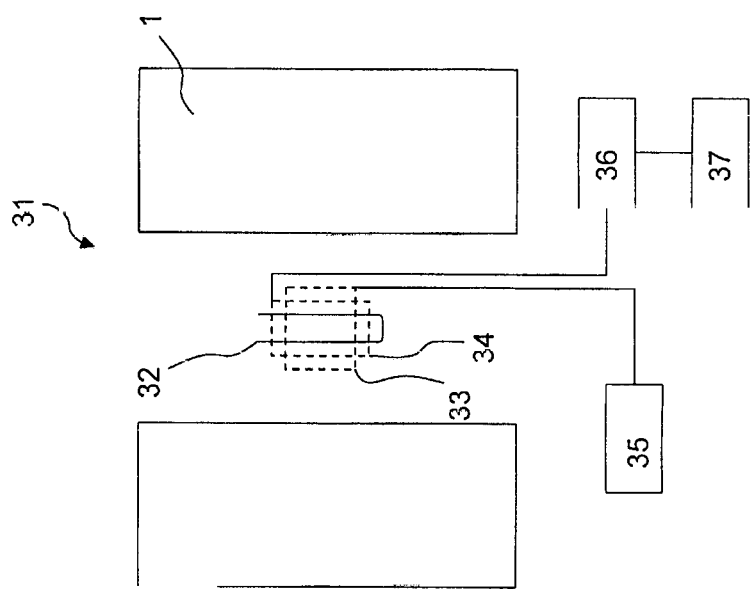
FIG. 6 a schematic representation of an NMR spectrometer according to the invention comprising a magnet coil system according to the invention.

FIG. 6 shows in an exemplary and schematic way an NMR spectrometer 31 according to the invention, which may employ a magnet coil system 1 according to the invention.

NMR spectrometer 31 comprises a magnet coil system (NMR magnet coil) 1 according to the invention as for example shown in FIG. 1, which is typically housed in a cryostat (not shown in detail). In the magnetic center of the magnet coil system 1, a sample 32 (e.g. a sample tube filled with a substance to be investigated) is arranged in a sample volume. Sample 32 is surrounded by an RF transmission coil 33 and an RF detection coil 34 (it should be noted that in other designs also combined RF transmission and detection coils are possible). By means of an RF generator 35 and the transmission coil 33 RF pulses are irradiated into the sample 32. By means of an RF detector 36 and the RF detection coil 34 the sample response 32 is measured. The measurement results are evaluated by means of an evaluation unit 37, and are for example transformed into an NMR spectrum.

Figure 7:
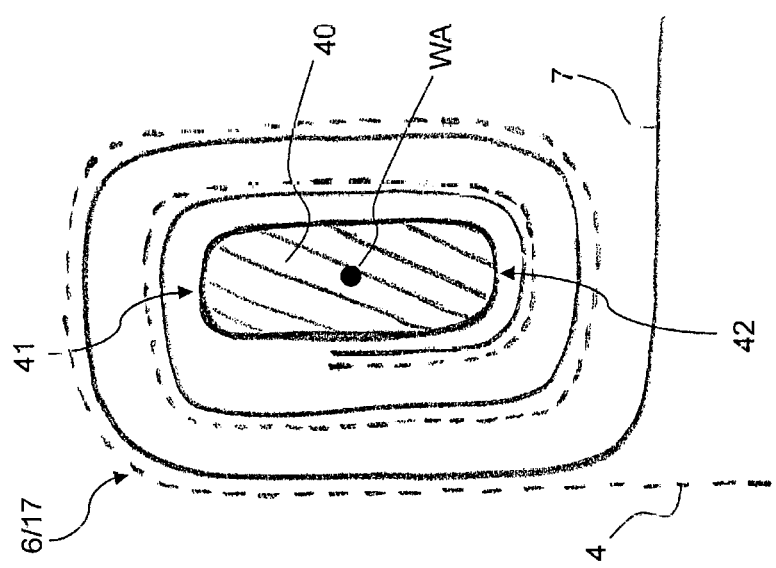
FIG. 7 a schematic cross section across a connecting section which is wound up to a pancake coil, with a winding form being elongated in the cross section.

FIG. 7 illustrates in a schematic cross section a further joint 6 or a connecting section 17, respectively, of an HTSL tape conductor 4 (dashed) and of an LTS wire 7 (continuous), similar to the representation and description of FIG. 3. For sake of simplification, in the following only the differences are explained in detail, and solder connecting the HTSL wire 4 and the LTS wire 7 is not detailed.

In the shown embodiment, the connecting section 17 is wound about a winding axis WA onto a winding form 40 with an elongated cross section. Ends 41, 42 opposing each other in the long direction have a rounded down shape, such that a fitting HTSL tape conductor 4 or LTS wire 7 does not experience a sharp bend at the transition from a long side to a short side. Joint 6 is designed to be particularly compact in direction from left to right (in FIG. 7), which may simplify the arrangement inside a cryostat.

Figure 8:
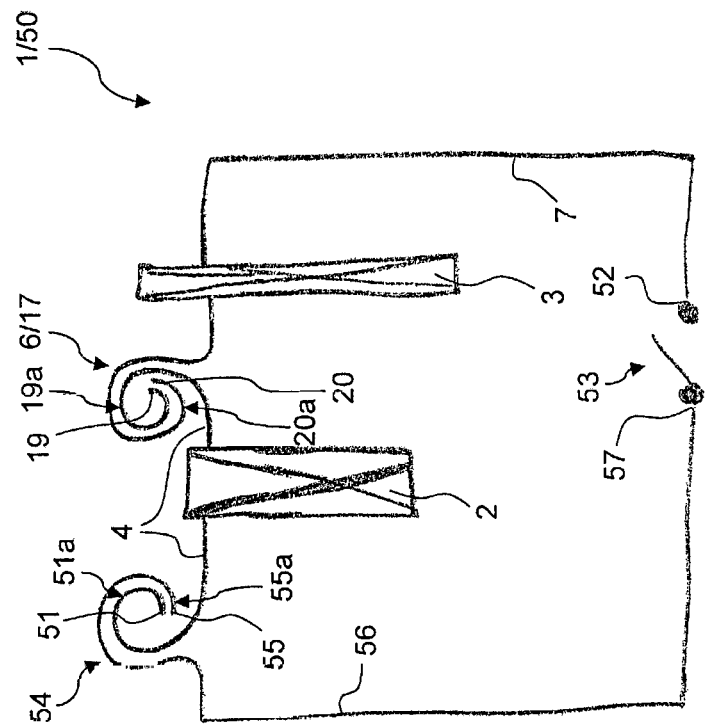
FIG. 8 a schematic representation of an electrical circuit of a further embodiment of a magnet coil system according the invention.

FIG. 8 shows schematically an electric circuit 50 of a further embodiment of a magnet coil system 1 according to the invention. Herein, a first coil section 2 is wound with an HTSL tape conductor 4. A first end section 19a ahead of a first end 19 of the HTSL tape conductor 4 is conductively connected to an end section 20a in front of a first end 20 of an LTS wire 7 (here with NbTi filaments) in a joint 6 or along a connecting section 17, respectively, the connecting section 17 being wound up.

LTS wire 7 forms a second coil section 3. LTS wire 7 ends with its second end 52 at a superconducting switch 53; in the range of the superconducting switch 53 a current input for charging the magnet coil system 1 may also be provided.

A second end section 51a ahead of a second end 51 of the HTSL tape conductor 4 is in a further joint 54 or in a further connecting section, respectively, connected to a first end section 55a ahead of a first end 55 of a further LTS wire 56 (here also with NbTi filaments). Further joint 54 or the further connecting section, respectively, are designed in a way corresponding to joint 6 or connecting section 17, respectively; in particular the further connecting section also being wound up. The further LTS wire 56 leads with its second end 57 to the other side of the superconducting switch 53.

In persistent current mode, with superconductively closed superconducting switch 53, the magnet coil system 1 may be operated with a constant current in a closed cycle, apart from a very small drift. Thereby, coil sections 2, 3 generate a temporally constant, static magnetic field Bo in a sample. The drift caused by joints 6, 54 may, where appropriate, be neglected or otherwise be compensated by per se known means of drift compensation.

Figure 9:
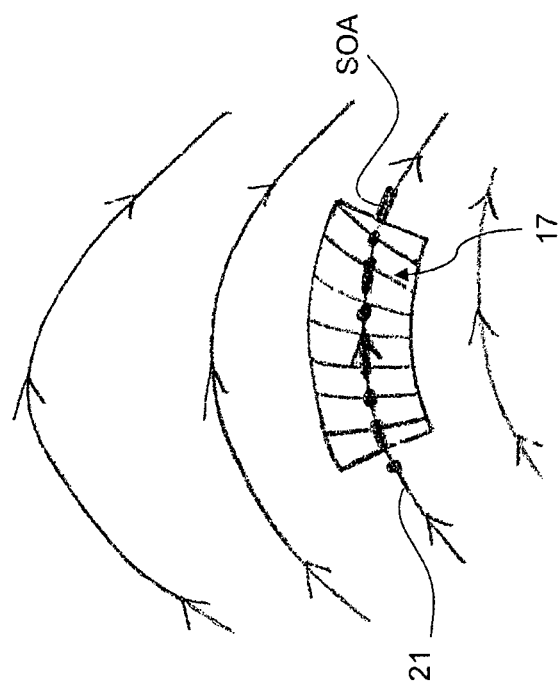
FIG. 9 a schematic representation of a connecting section for the invention, which is wound in the manner of a solenoidal coil with a curved solenoid coil.

FIG. 9 shows a connecting section 17 wound in the manner of a solenoidal coil. However, the associated solenoid coil axis SOA, represented in FIG. 9 by a dot and dash curve, is bent and the HTSL tape conductor and the LTS wire are wound about this bent axis. Thereby, the curvature corresponds to the distribution of the local magnetic field 21 in the radial center of connecting section 17. In this way, transverse components of the magnetic field (which run perpendicular to the local tape plane in the HTSL tape conductor) may be minimized, such that the current carrying capacity of the connecting section 17 is maximized.

We claim:

1. A magnet coil system, comprising:
   a first coil section, wound with a high temperature superconducting (=HTSL) tape conductor;

a second coil section comprising a low temperature superconducting (=LTS) wire, wherein said HTSL-tape conductor and said LTS wire are electrically connected in series; and a wound up connecting section forming a joint between said HTSL-tape conductor and said LTS wire, wherein a first end section of said HTSL-tape conductor located ahead of a first end of said HTSL-tape conductor and a second end section of said LTS wire located prior to a second end of said LTS wire are connected electrically via an ohmic contact in said connecting section and along a length of said connecting section, said LTS wire having a flat shape within said connecting section, which abuts said HTSL-tape conductor, said connecting section thereby having a length of at least 5 m;

the magnet coil system further comprising a further LTS wire, wherein said HTSL tape conductor forms a further joint to said further LTS wire at a third end section ahead of a third end of said HTSL tape conductor.

2. The magnet coil system of claim 1, wherein, within said connecting section, a respective local tape plane of said HTSL tape conductor substantially extends along a winding axis, wherein said connecting section is positioned such that, during operation of the magnet coil system, a magnetic field generated by the magnet coil system in a region of said connecting section is substantially parallel to said winding axis.

3. The magnet coil system of claim 1, wherein said connecting section is wound in a manner of a pancake-coil.

4. The magnet coil system of claim 2, wherein said connecting section is wound in a manner of a pancake-coil.

5. The magnet coil system of claim 4, wherein said connecting section is wound in a manner of a solenoid coil.

6. The magnet coil system of claim 2, wherein said connecting section is wound in a manner of a solenoid coil.

7. The magnet coil system of claim 4, wherein said connecting section is wound in a manner of a solenoid coil and is wound around a solenoid coil axis which is curved or is wound around a solenoid axis having a curvature that follows field lines of a local magnetic field generated during operation of the magnet coil system.

8. The magnet coil system of claim 4, wherein said first and said second ends of said HTSL tape conductor and said LTS wire are located on a same side of said connecting section, wherein said connecting section is wound such that said first and said second ends of said HTSL tape conductor and of said LTS wire have a radially inner position.

9. The magnet coil system of claim 2, wherein said first and said second ends of said HTSL tape conductor and said LTS wire are located on a same side of said connecting section, wherein said connecting section is wound such that said first and said second ends of said HTSL tape conductor and of said LTS wire have a radially inner position.

10. The magnet coil system of claim 3, wherein said first and said second ends of said HTSL tape conductor and said LTS wire are located on a same side of said connecting section, wherein said connecting section is wound such that said first and said second ends of said HTSL tape conductor and of said LTS wire have a radially inner position.

11. The magnet coil system of claim 4, wherein said first and said second ends of said HTSL tape conductor and said LTS wire are located on a same side of said connecting section, wherein said connecting section is wound such that said first and said second ends of said HTSL tape conductor and of said LTS wire have a radially inner position.

12. The magnet coil system of claim 5, wherein said first and said second ends of said HTSL tape conductor and said LTS wire are located on a same side of said connecting section, wherein said connecting section is wound such that said first and said second ends of said HTSL tape conductor and of said LTS wire have a radially inner position.

13. The magnet coil system of claim 6, wherein said first and said second ends of said HTSL tape conductor and said LTS wire are located on a same side of said connecting section, wherein said connecting section is wound such that said first and said second ends of said HTSL tape conductor and of said LTS wire have a radially inner position.

14. The magnet coil system of claim 7, wherein said first and said second ends of said HTSL tape conductor and said LTS wire are located on a same side of said connecting section, wherein said connecting section is wound such that said first and said second ends of said HTSL tape conductor and of said LTS wire have a radially inner position.

15. The magnet coil system of claim 4, further comprising an additional LTS wire, wherein said LTS wire and said additional LTS wire contain different superconducting LTS materials or said additional LTS wire contains Nb3Sn, wherein said LTS wire has an additional joint at a fourth end section ahead of a fourth end and spaced apart from said HTSL tape conductor, wherein said additional joint connects said LTS wire to a fifth end section of said additional LTS wire.

16. The magnet coil system of claim 1, wherein said LTS wire and said further LTS wire contain a same superconducting LTS material.

17. The magnet coil system of claim 15, wherein said LTS wire and said further LTS wire contain a same superconducting LTS material.

18. An NMR spectrometer comprising the magnet coil system of claim 1.

19. An NMR spectrometer comprising the magnet coil system of claim 15.

* * * * *